(12) United States Patent
Watanabe et al.

(10) Patent No.: US 11,512,411 B2
(45) Date of Patent: Nov. 29, 2022

(54) PTFE SHEET AND METHOD FOR MOUNTING DIE

(71) Applicants: SHINKAWA LTD., Tokyo (JP); VALQUA, LTD., Tokyo (JP)

(72) Inventors: Osamu Watanabe, Tokyo (JP); Tomonori Nakamura, Tokyo (JP); Yoshihito Hagiwara, Tokyo (JP); Yuji Kanai, Tokyo (JP)

(73) Assignees: SHINKAWA LTD., Tokyo (JP); VALQUA, LTD., Tokyo (JP)

( * ) Notice: Subject to any disclaimer, the term of this patent is extended or adjusted under 35 U.S.C. 154(b) by 272 days.

(21) Appl. No.: 16/767,602

(22) PCT Filed: Nov. 28, 2018

(86) PCT No.: PCT/JP2018/043802
§ 371 (c)(1),
(2) Date: May 28, 2020

(87) PCT Pub. No.: WO2019/107419
PCT Pub. Date: Jun. 6, 2019

(65) Prior Publication Data
US 2020/0291548 A1 Sep. 17, 2020

(30) Foreign Application Priority Data
Nov. 30, 2017 (JP) .............................. JP2017-230376

(51) Int. Cl.
*H01L 23/00* (2006.01)
*D01F 6/12* (2006.01)

(52) U.S. Cl.
CPC ................ *D01F 6/12* (2013.01); *H01L 24/75* (2013.01); *H01L 24/83* (2013.01); *H01L 2224/75301* (2013.01); *H01L 2224/75743* (2013.01)

(58) Field of Classification Search
None
See application file for complete search history.

(56) References Cited

U.S. PATENT DOCUMENTS

| 2012/0043005 A1 | 2/2012 | Yamakami et al. |
| 2016/0075914 A1* | 3/2016 | Dutta ..................... B01D 71/36 |
| | | 428/319.3 |

(Continued)

FOREIGN PATENT DOCUMENTS

| JP | H03201458 | 9/1991 |
| JP | 2003218590 | 7/2003 |

(Continued)

OTHER PUBLICATIONS

"International Search Report (Form PCT/ISA/210) of PCT/JP2018/043802," dated Jan. 15, 2019, with English translation thereof, pp. 1-4.

(Continued)

*Primary Examiner* — Hsien Ming Lee
(74) *Attorney, Agent, or Firm* — JCIPRNET

(57) ABSTRACT

A PTFE sheet in which PTFE fibers having a diameter of 1 µm or less are spun, the PTFE sheet having a Gurley value in the range of 1 s/100 cc/in$^2$ to 3 s/100 cc/in$^2$ and a shrinkage factor in a direction orthogonal to a sheet winding direction of no more than 10% when heated to 300° C. The PTFE sheet makes a die adsorbable via a tool, which is for heating the die when the die is mounted on a mounting body, by being sandwiched between the die and the tool, and suppresses the adhesion, to an adsorption surface of the tool or to the die, of an adhesion member for fixing the die to the mounted body. Through this configuration, a PTFE sheet capable of stabilizing vacuum adsorption and improving maintainability and a method for mounting a die are provided.

6 Claims, 6 Drawing Sheets

(56) References Cited

U.S. PATENT DOCUMENTS

| | | | | |
|---|---|---|---|---|
| 2020/0311311 A1* | 10/2020 | Yen | ............. | G06F 21/64 |
| 2020/0321311 A1* | 10/2020 | Watanabe | ............. | H01L 24/75 |
| 2020/0388507 A1* | 12/2020 | Seyama | ............. | H01L 24/75 |

FOREIGN PATENT DOCUMENTS

| | | |
|---|---|---|
| JP | 2006066625 | 3/2006 |
| JP | 2006066767 | 3/2006 |
| JP | 2012044071 | 3/2012 |
| JP | 5669137 | 2/2015 |
| KR | 20010038101 | 5/2001 |
| TW | 201209967 | 3/2012 |

OTHER PUBLICATIONS

Valqua, LTD., "Technical History", Jan. 15, 2015, Available at: http://www.valqua.co.jp/technical/. with partial English translation, pp. 1-33.

\* cited by examiner

PTFE SHEET AND METHOD FOR MOUNTING DIE

CROSS-REFERENCE TO RELATED APPLICATION

This application is a 371 application of the International PCT application serial no. PCT/JP2018/043802, filed on Nov. 28, 2018, which claims the priority benefit of Japan Patent Application No. 2017-230376, filed on Nov. 30, 2017. The entirety of each of the above—mentioned patent applications is hereby incorporated by reference herein and made a part of this specification.

TECHNICAL FIELD

The present invention relates to a creeping-up preventing polytetrafluoroethylene (PTFE) sheet used for mounting a die and a method of mounting a die.

BACKGROUND ART

A technology in which a plurality of dies divided into individual pieces by dicing is picked up using vacuum adsorption is known (see Patent Literature 1 to 3). For example, Patent Literature 2 discloses that a bare chip on which bumps are provided on terminals thereof is vacuum-adsorbed on a surface side opposite to a circuit function surface of the bare chip including terminals and bumps. The bare chip vacuum-adsorbed to a tool is mounted on a substrate to which an adhesive has been applied with an orientation in which the circuit function surface faces the substrate. In the invention of Patent Literature 2, in order to prevent the adhesive on the substrate from creeping upward from a lateral surface of the bare chip due to vacuum adsorption or pressurization of the tool, a configuration in which a sheet is interposed between an adsorption surface of the tool and the bare chip is employed, thereby inhibiting creeping up of the adhesive and preventing the adhesive from adhering to the tool. Further, Patent Literature 3 describes a semiconductor chip being adsorbed via a porous tape having air permeability.

CITATION LIST

Patent Literature

[Patent Literature 1]
  Japanese Patent Laid-Open No. 2006-66625
[Patent Literature 2]
  Japanese Patent Publication No. 5669137
[Patent Literature 3]
  Japanese Patent Laid-Open No. H03-201458

SUMMARY OF INVENTION

Technical Problem

Here, the invention of Patent Literature 2 is based on the premise that the bare chip is vacuum-adsorbed on the circuit function surface and does not consider vacuum adsorption on the bump formation surface side on which bump electrodes are formed. In this respect, since irregularities are formed on the bump formation surface due to the bump electrodes, when a die is vacuum-adsorbed by the tool, a gap may be formed between the tool adsorption surface and the die due to a protrusion height of the bump electrodes. Therefore, when the die is vacuum-adsorbed, there are cases in which air leakage occurs and a vacuum level is reduced, thereby deteriorating adsorption properties of the tool.

Also, when a die is mounted on the substrate via an adhesive material, there are cases in which fume gases are generated from the adhesive material, and the fume gases flow in from the gap generated due to the protrusion height of the bump electrodes, thereby contaminating the tool or the like. Therefore, the tool or the like is required to be cleaned frequently, and thereby maintainability may be deteriorated.

Further, Patent Literature 3 describes that sponge, paper, synthetic rubber, or the like is used as a material for the porous tape, but since these materials are weak with respect to heat and may shrink, melt, and deform, they are not suitable for a process in which a die is heated to 250° C. or higher to be mounted on a substrate by a tool.

The present invention has been made in view of such circumstances and an objective of the present invention is to provide a creeping-up preventing sheet capable of stabilizing vacuum adsorption and improving maintainability.

Solution to Problem

[1] A polytetrafluoroethylene (PTFE) sheet in which PTFE fibers having a diameter of 1 μm or less are spun, in which a PTFE sheet having a Gurley value in a range of 1 to 3 s/100 cc/in$^2$ and a shrinkage factor of 10% or less in a direction perpendicular to a sheet winding direction when heated to 300° C. is sandwiched between a tool for heating a die and a die when the die is mounted on a mounting body so that the die is able to be adsorbed by the tool and adhering of an adhesive member for fixing the die to the mounting body to an adsorption surface of the tool or the die is inhibited.

[2] The PTFE sheet according to above-described [1], in which the PTFE sheet may have a thickness equal to or greater than a protrusion height of a bump electrode on a bump formation surface of the die and be able to adsorb the bump formation surface of the die.

[3] The PTFE sheet according to above-described [1], in which the PTFE sheet may be made of a material softer than that of the bump electrode or the adsorption surface.

[4] The PTFE sheet according to any one of above-described to, in which the tool may be configured to mount the die on a bonding region of the mounting body by heating the die and the adhesive member using a vacuum adsorption tool, and the PTFE sheet may serve as a filter which inhibits fume gases generated when the die or the adhesive material is heated entering a suction hole of the tool.

[5] A method of mounting a die including a step of preparing a die including a bump formation surface on which a plurality of bump electrodes is formed, a step of preparing a polytetrafluoroethylene (PTFE) sheet in which PTFE fibers having a diameter of 1 μm or less are spun, a Gurley value is in a range of 1 to 3 s/100 cc/in$^2$, and a shrinkage factor in a direction perpendicular to a sheet winding direction when heated to 300° C. is 10% or less, a step of disposing a vacuum adsorption tool having an adsorption surface above the die such that the adsorption surface faces the bump formation surface, a step of sandwiching the PTFE sheet between the adsorption surface and the bump formation surface and adsorbing the die using the vacuum adsorption tool, and a step of mounting the die adsorbed by the vacuum adsorption tool on a bonding region of a substrate via an adhesive material, in which the PTFE sheet has a thickness equal to or greater than a protrusion height of the bump electrode on the bump formation surface.

Advantageous Effects of Invention

According to the present invention, stabilization of vacuum adsorption and improvement in maintainability can be achieved.

DESCRIPTION OF EMBODIMENTS

Hereinafter, embodiments of the present invention will be described. In the following description of the drawings, the same or similar components are denoted by the same or similar reference signs. The drawings are merely examples, dimensions and shapes of the respective parts are schematic, and the technical scope of the present invention should not be interpreted as being limited to the embodiments. Further, in this specification, when a numerical range is described as "A to B", it indicates "not less than A and not more than B."

EMBODIMENT

Figure 1:
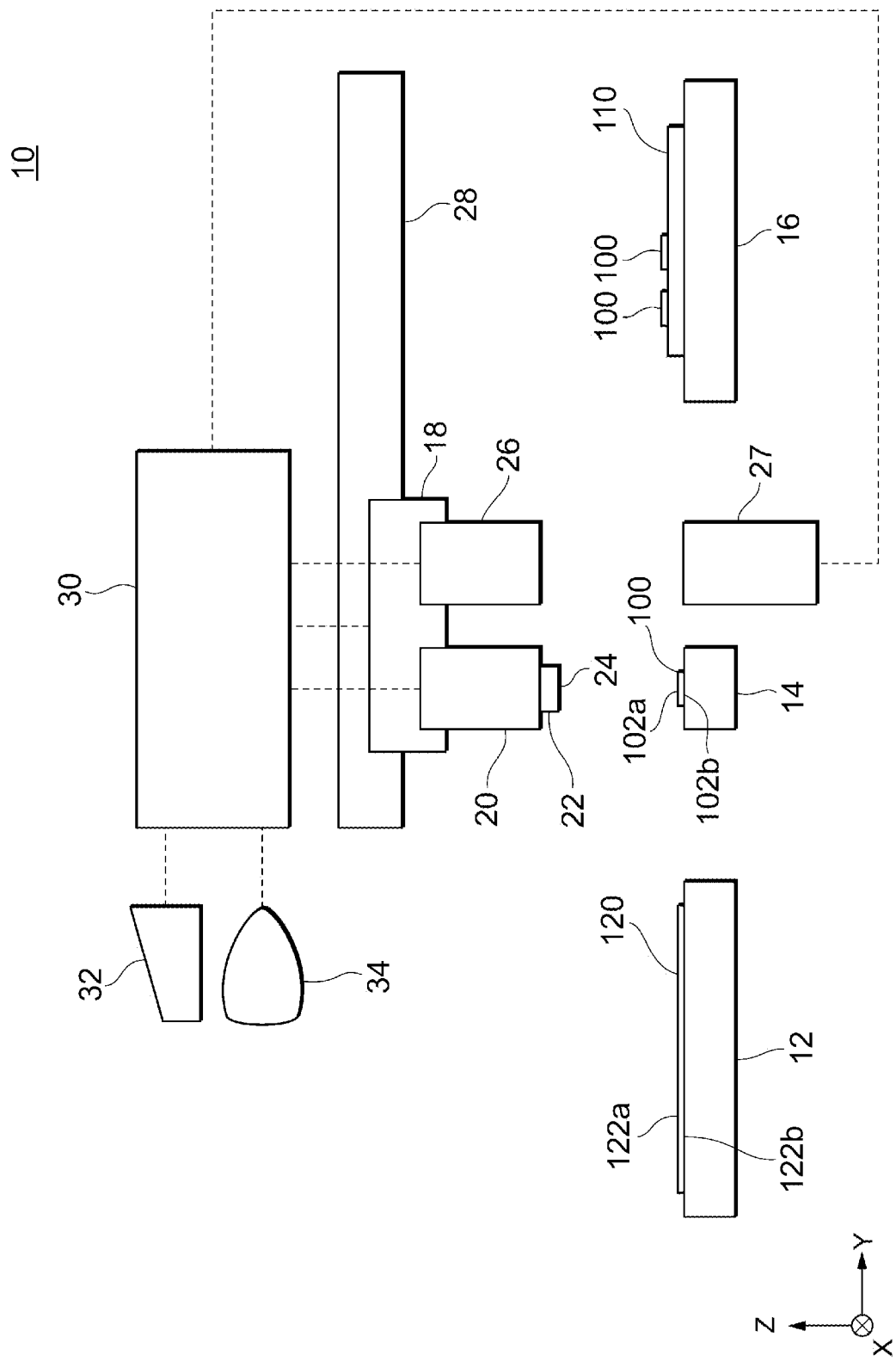
FIG. 1 is a view illustrating a bonding device used for a method of mounting a die according to an embodiment of the present invention.

FIG. 1 is a view schematically illustrating a bonding device 10 used for a method of mounting a die according to an embodiment of the present invention. The bonding device 10 is a die bonding device for mounting a die 100 in a bonding region of a substrate 110.

The die 100 is made of a semiconductor material. The die 100 is formed in a rectangular parallelepiped shape having a surface, which is a main surface, and a back surface. Specifically, the die 100 includes a first surface 102a which is the surface on which a predetermined circuit pattern is formed, and a second surface 102b which is the back surface on a side opposite to the first surface 102a. In the present embodiment, the die 100 is mounted on the substrate 110 such that the second surface 102b of the die 100 faces the substrate 110. A mounting mode in such an orientation is generally called die bonding. Details of the first surface 102a of the die 100 will be described below.

The bonding device 10 includes a wafer stage 12, an intermediate stage 14, a bonding stage 16, a bonding head 18, a vacuum adsorption tool 22 attached to the bonding head 18 with a Z-axis drive mechanism 20 therebetween, imaging units 26 and 27 for acquiring image information of the die 100, an XY table 28 for moving the bonding head 18 in XY axes directions, and a control unit 30 that controls operations of these components of various types.

In the following description, the XY axes directions are directions parallel to the main surface of the die 100 (or a main surface of any one of stages), and a Z-axis direction is a direction perpendicular to a surface formed by the XY axes directions. Further, the X-axis direction and the Y-axis direction are perpendicular to each other.

A wafer 120 consisting of a plurality of dies 100 divided into individual pieces is placed on the wafer stage 12. The wafer 120 includes a first surface 122a (corresponding to the first surface 102a of the die 100) which is a surface on which a predetermined circuit pattern is formed, and a second surface 122b (corresponding to the second surface 102b of the die 100) which is a back surface on a side opposite to the first surface 122a. The wafer 120 may be fixed on the wafer stage 12 by affixing the second surface 122b to a film on the wafer stage 12. The die 100 on the wafer stage 12 is picked up by a cooperative operation of the vacuum adsorption tool 22 and a pickup unit (not illustrated) and then transferred to the intermediate stage 14 by a transfer head (not illustrated).

The intermediate stage 14 is a stage for temporarily placing the die 100. The intermediate stage is disposed between the wafer stage 12 and the bonding stage 16. The die 100 is disposed on the intermediate stage 14 with an orientation in which the second surface 102b faces the intermediate stage 14. The intermediate stage 14 is configured to be movable in the XY axes directions by a drive mechanism such as a linear motor (not illustrated). The die 100 is fixed on the intermediate stage 14 by affixing the second surface 102b to a film on the intermediate stage 14. The die 100 on the intermediate stage 14 is picked up by a cooperative operation of the adsorption tool 22 and a pickup unit (not illustrated) and then transferred to the bonding stage 16 by a transfer head (not illustrated).

The substrate 110 is disposed on the bonding stage 16. The substrate 110 may be fixed on the bonding stage 16 by, for example, being affixed to a film on the bonding stage 16. The substrate 110 has at least one bonding region, and any of the dies 100 is mounted on the bonding region. For example, when the substrate 110 has a plurality of bonding regions, the dies 100 are mounted on the respective bonding regions, thereafter the substrate 110 is divided into individual pieces for each bonding region, and thereby a plurality of finished products (semiconductor devices) can be obtained.

Also, the plurality of dies 100 may be mounted by being stacked in each bonding region on the substrate 110. In such a semiconductor device of a stacked type, all of the two or more dies 100 stacked in a same bonding region may be mounted such that the first surface 102a faces in a direction opposite to the substrate 110. Alternatively, some of the dies stacked in the same bonding region may be mounted in a different direction from other dies.

A material from which the substrate 110 is formed may be, for example, an organic material (for example, an epoxy substrate or a polyimide substrate), an inorganic material (for example, a glass substrate), or a composite material thereof (for example, a glass epoxy substrate). The substrate 110 may be a so-called interposer. Also, the substrate 110 may be formed of a metal material (for example, a lead frame material).

Further, the bonding stage 16 is configured to be able to move the substrate 110 in the X-axis direction using a drive mechanism such as a guide rail (not illustrated). Also, the bonding stage 16 includes a heating means for heating the substrate 110.

The vacuum adsorption tool 22 is attached to the bonding head 18 via the Z-axis drive mechanism 20, and the imaging unit 26 is attached to the bonding head 18 at a position separated from the vacuum adsorption tool 22 by a predetermined distance. In other words, in the example illustrated in FIG. 1, the vacuum adsorption tool 22 and the imaging unit 26 are fixed to the bonding head 18, and both the vacuum adsorption tool 22 and the imaging unit 26 move in the XY axes directions when the bonding head 18 moves due to the XY table 28. Also, the imaging unit 27 may be provided on a side opposite to the imaging unit 26. The imaging unit 26 can image the first surface 102a of the die 100, and the imaging unit 27 can image the second surface 102b of the die 100. Further, the imaging unit 26 may not be fixed to the bonding head 18 and may be movable separately from the vacuum adsorption tool 22.

The vacuum adsorption tool 22 includes an adsorption surface 24 which vacuum-adsorbs the die 100. The vacuum adsorption tool 22 is configured to adsorb and hold the die 100 for transferring the die 100 to a predetermined position and apply pressure for mounting the die 100 on the substrate 110. Further, details of the vacuum adsorption tool 22 will be described below.

The control unit 30 controls necessary processing for bonding by the bonding device 10. The control unit 30 performs position control of the vacuum adsorption tool 22 including XYZ-axis driving, θ axis driving (rotation around the Z-axis), and tilt driving (inclination direction) of the vacuum adsorption tool 22, ON or OFF control of evacuation, load control when the die 100 is mounted on the substrate 110, heating control of the substrate 110, or the like. The control unit 30 is connected to be able to transmit and receive signals to and from each component such as the bonding head 18, the vacuum adsorption tool 22, the imaging unit 26, or the like, thereby controlling operations of these.

An operation unit 32 for inputting control information and a display unit 34 for outputting control information are connected to the control unit 30. Thereby, it is configured such that an operator can input necessary control information using the operation unit 32 while viewing a screen on the display unit 34.

The control unit 30 is a computer device including a central processing unit (CPU), a memory, or the like, and a bonding program or the like for performing processing required for bonding is stored in the memory in advance. The control unit 30 is configured to be able to execute each step related to a method of mounting a die according to the present embodiment to be described below (for example, includes a program for causing the computer to execute each operation).

Next, a method of mounting a die according to the present embodiment will be described with reference to FIGS. 2 to 5. The method of mounting a die according to the present embodiment can be performed using the bonding device 10 illustrated in FIG. 1.

Figure 2:
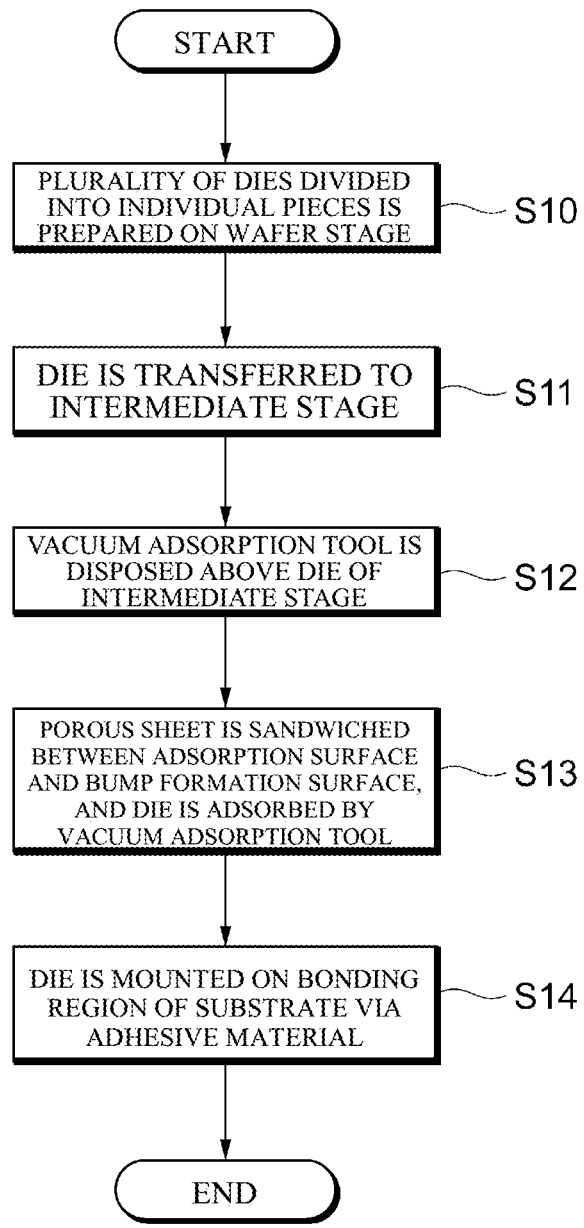
FIG. 2 is a view showing a flowchart of the method of mounting a die according to the embodiment of the present invention.
Figure 3:
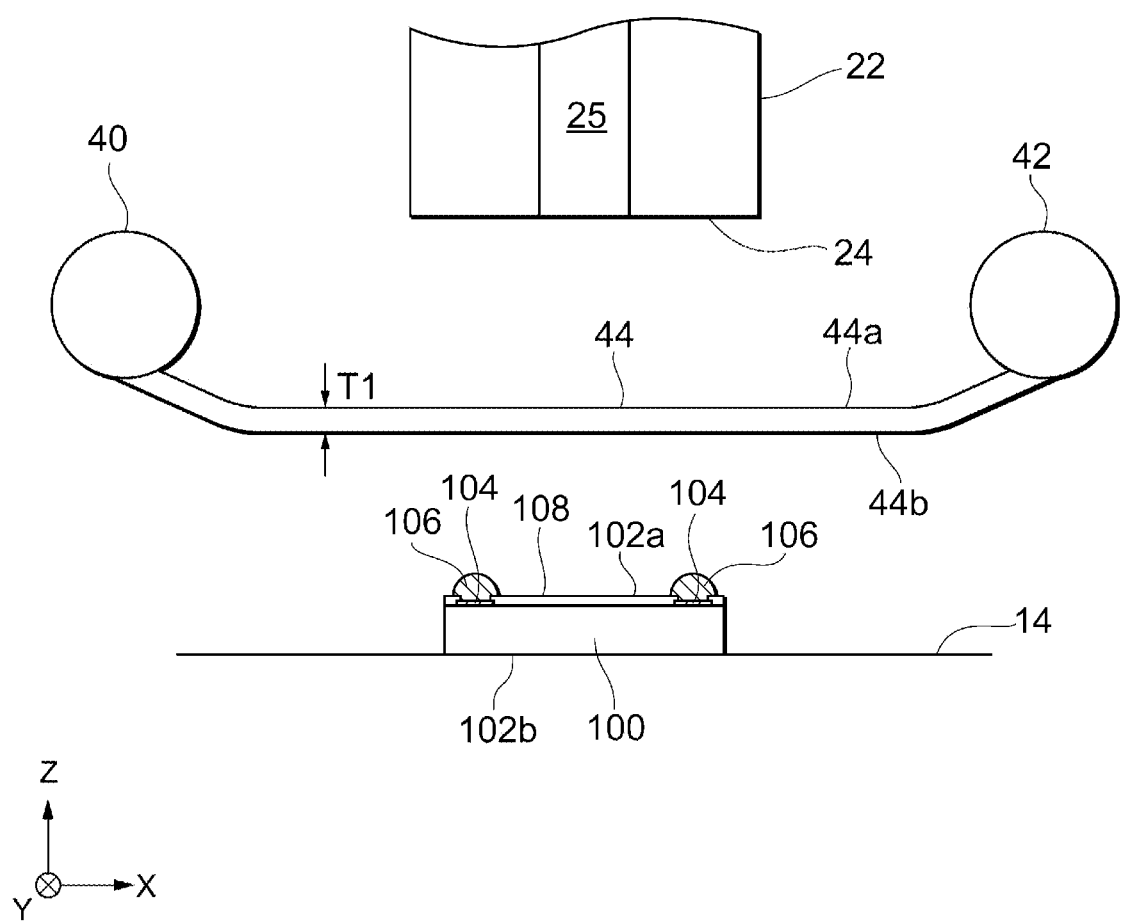
FIG. 3 is a view for explaining the method of mounting a die according to the embodiment of the present invention and, specifically, is a view illustrating a step of disposing a tool above the die.
Figure 4:
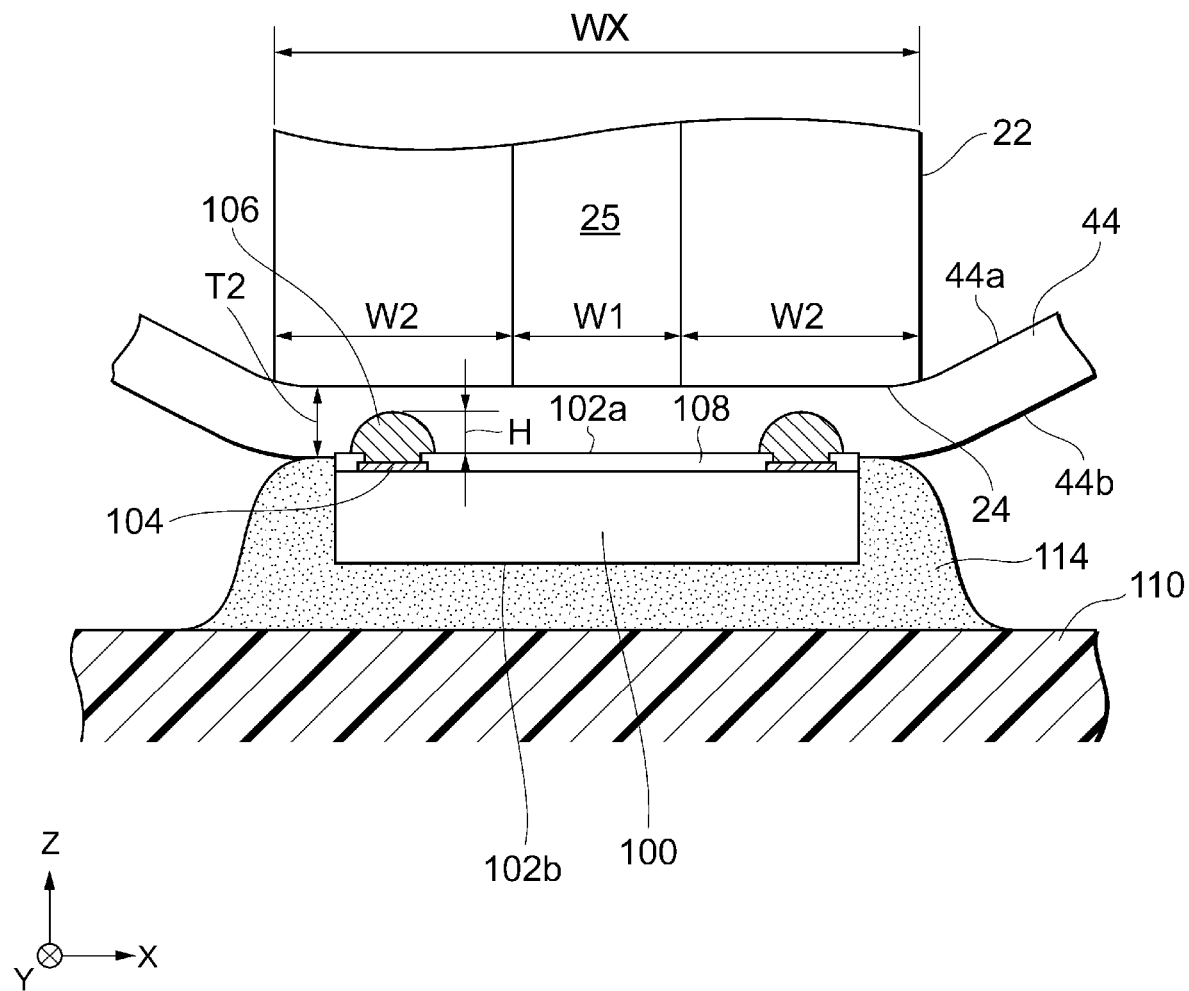
FIG. 4 is a view for explaining the method of mounting a die according to the embodiment of the present invention and, specifically, is a view illustrating a step of mounting the die adsorbed by the tool on a substrate via an adhesive material.
Figure 5:
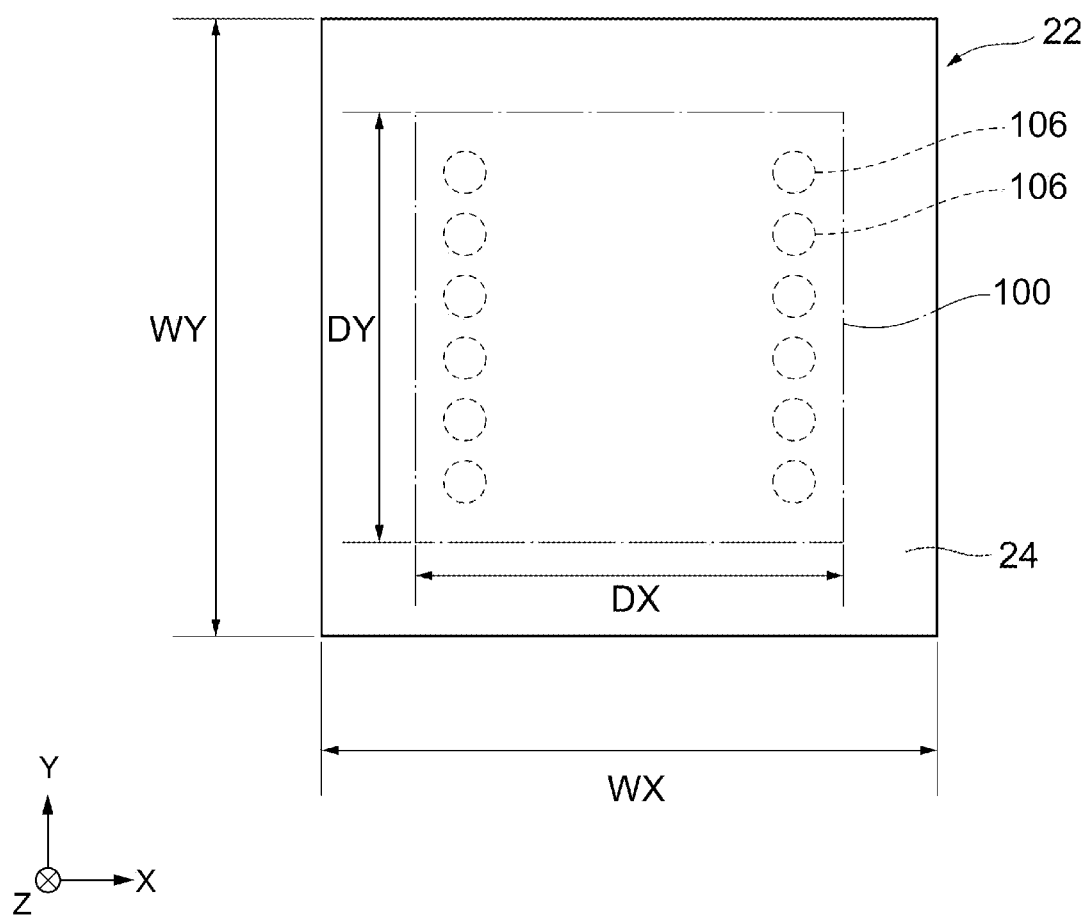
FIG. 5 is a view for explaining the method of mounting a die according to the embodiment of the present invention and, specifically, is a plan view illustrating a size relationship between an adsorption surface of the tool and a bump formation surface of the die.

Here, FIG. 2 is a flowchart for explaining the method of mounting a die according to the present embodiment. FIG. 3 is a view illustrating a step of disposing a tool above a die, and FIG. 4 is a view illustrating a step of mounting the die adsorbed by the tool on a substrate via an adhesive material. Also, FIG. 5 is a plan view illustrating a size relationship between an adsorption surface of the tool and a bump formation surface of the die.

First, the plurality of dies 100 divided into individual pieces is prepared on the wafer stage 12 (S10). Specifically, the wafer 120 consisting of the plurality of dies 100 affixed to a film is prepared on the wafer stage 12 as illustrated in FIG. 1. The wafer 120 is disposed on the wafer stage 12 such that each of the plurality of dies 100 has the first surface 102a facing upward and the second surface 102b facing the wafer stage 12.

Next, the die 100 is transferred to the intermediate stage 14 (S11). Specifically, the plurality of dies 100 on the wafer stage 12 is transferred to the intermediate stage 14 one at a time. As described above, the transfer of the die 100 may be performed by the vacuum adsorption tool 22.

Next, the vacuum adsorption tool 22 is disposed above the die 100 of the intermediate stage 14 (S12). Here, details of the vacuum adsorption tool 22 and the die 100 will be further described.

The vacuum adsorption tool 22 has the adsorption surface 24 facing the first surface 102a of the die 100. Also, at least one suction hole 25 for evacuating is provided on the adsorption surface 24. The suction hole 25 may be provided at a center of the adsorption surface 24 in the XY plan view.

As illustrated in FIG. 3, the die 100 is fixed on the intermediate stage 14 by the second surface 102b affixed to a film (not illustrated) on the intermediate stage 14. A plurality of electrode pads 104, a plurality of bump electrodes 106 provided on the plurality of electrode pads 104, and a protective film 108 provided around the plurality of bump electrodes 106 are provided on the first surface 102a of the die 100. The electrode pads 104 are terminals electrically connected to a circuit pattern formed on the first surface 102a. Also, an outer circumferential end portion of each of the electrode pads 104 is covered with the protective film 108, and a central portion of the electrode pad 104 exposed thereby serves as a connection part with the bump electrode 106.

As illustrated in FIG. 4, the bump electrode 106 has a height H protruding further than an upper surface of the protective film 108 on the first surface 102a. The height H of the bump electrode 106 is a distance between a top of the bump electrode 106 and the upper surface of the protective film 108.

Although materials of the electrode pad 104 and the bump electrode 106 are not limited, for example, the electrode pad 104 may be aluminum, copper, or the like, and the bump electrode 106 may be gold or the like.

In the example illustrated in FIG. 3, a porous sheet 44 is disposed between the first surface 102a of the die 100 and the adsorption surface 24 of the vacuum adsorption tool 22. The porous sheet 44 can be disposed between the die 100 and the vacuum adsorption tool 22, for example, by disposing a pair of reels 40 and 42 on which the porous sheet 44 is mounted above the intermediate stage 14. The pair of reels 40 and 42 are constituted by a supply reel 40 and a winding reel 42. When a part of the porous sheet 44 supplied from the supply reel 40 is transported to the winding reel 42, a partial region of the porous sheet 44 can be fed in sequence between the first surface 102a of the die 100 and the adsorption surface 24 of the vacuum adsorption tool 22.

In the example illustrated in FIG. 3, the porous sheet 44 has a winding direction in the X-axis direction in which the reels 40 and 42 are aligned, a width direction in the Y-axis direction, and a thickness direction in the Z-axis direction. The porous sheet 44 has a first surface 44a facing the adsorption surface 24 of the vacuum adsorption tool 22 and a second surface 44b facing the first surface 102a of the die 100, and a distance between the first surface 44a and the second surface 44b is a thickness of the porous sheet 44. As illustrated in FIG. 3, the porous sheet 44 has a thickness T1. The thickness T1 and the height H of the bump electrode 106 have a relationship of T1≥H. In this case, the thickness T1 of the porous sheet 44 is preferably 1 to 5 times the height H of the bump electrode 106, but the porous sheet 44 having a thickness within a range that does not hinder heat conduction from a heater can be used.

A length in the width direction of the porous sheet 44 is larger than a width in the Y-axis direction of the first surface 102a of the die 100 and is larger than a width in the Y-axis direction of the vacuum adsorption tool 22. Thereby, the porous sheet 44 can be reliably interposed between the first surface 102a of the die 100 and the adsorption surface 24 of the vacuum adsorption tool 22.

The porous sheet 44 has a plurality of pores so that it is permeable to air between the first surface 44a and the second surface 44b. A Gurley value of the porous sheet 44 is preferably small in order to adsorb a chip and is preferably has a range of, for example, 1 to 3 (s/100 cc/in$^2$).

The porous sheet 44 is made of a soft material compared to both the bump electrode 106 and the adsorption surface 24 in order to at least partially absorb a protrusion height of the bump electrode 106 due to the first surface 102a when the die 100 is mounted on the substrate 110. For example, a compressive stress of the porous sheet 44 is 0.12 MPa, which is smaller than a compressive stress of 110 GPa of copper or a compressive stress of 80 GPa of gold used for the bump. Therefore, the porous sheet 44 is more easily deformed than a metal used for the bump electrode such as copper or gold. Further, the compressive stress of the porous sheet 44 is calculated from a gradient between a load and a strain amount when the porous sheet 44 is pressed with a predetermined load.

The porous sheet 44 is a spun sheet in which polytetrafluoroethylene (PTFE) nanofibers are spun. The porous sheet 44 having a pore diameter of about 1 to 2 μm, a thickness of about 50 μm, and a Gurley value of 1 to 2 (s/100 cc/in$^2$) may be used. The PTFE nanofibers can be made to have a small Gurley value (that is, improved air permeability) despite being thick. Also, the porous sheet 44 using the PTFE nanofibers can reduce heat shrinkage and suppress sheet deformation such as curling of the sheet even when it is heated to 260° C. to 300° C.

The porous sheet 44 has a shrinkage factor of 0% at 250° C., 0% to 0.5% at 300° C., and 5% to 9% at 350° C. in the width direction (Y direction) perpendicular to the winding direction (X direction), and has a shrinkage factor of 4.2% to 5.7% at 250° C., 4.7% to 0.5.8% at 300° C., and 12.4% to 14.0% at 350° C. in the winding direction. On the other hand, a stretched sheet whose shape is fixed by stretching PTFE at a low temperature and then applying heat below a melting point has a shrinkage factor of 29.9% to 31.9% at 250° C., 35.0% to 38.0% at 300° C., and 48.7% to 53.3% at 350° C. in the width direction, and has a shrinkage factor of 30% to 42% at 250° C., 36% to 47% at 300° C., and 50% to 55% at 350° C. in the sheet winding direction. That is, as compared with the stretched sheet, the porous sheet 44 has a shrinkage factor of about ⅕ in the width direction and has a shrinkage factor of about ¼ in the sheet winding direction.

Further, since the porous sheet 44 wound on the roll as in the present embodiment is long in the winding direction, even when the porous sheet 44 shrinks in the winding direction, the shrinkage does not affect an effect of inhibiting the adhesive material creeping up, which will be described below.

In the manufacturing process of the semiconductor device described in the present embodiment, the die 100 and an adhesive material 114 are heated to 250° C. to 300° C. by a heater incorporated in the vacuum adsorption tool 22. At this time, the heater and the vacuum adsorption tool 22 are heated to about 300° C. to 350° C., which is higher than a target temperature for heating the die 100, and the porous sheet 44 is also exposed to heat of 300° C. to 350° C.

As illustrated in FIG. 4, when the die 100 is mounted on the substrate 110, the porous sheet 44 is used for inhibiting a liquid adhesive material 114 or a film-like adhesive material 114 melted by heat creeping up and adhering to the adsorption surface 24 of the vacuum adsorption tool 22 or an upper surface of the die 100. When the adhesive material 114 adheres to the die 100, it causes poor bonding of the electrodes or the like. Further, when the adhesive material 114 adheres to the adsorption surface 24, the adhesive material 114 adhered thereto is transferred to the die 100 and causes a defect in the same manner.

The die 100 may be stacked not only on the substrate 110 but also on another die 100 that has already been mounted on the substrate 110. In this case, the porous sheet 44 inhibits the adhesive material 114 on the substrate 110 or the adhesive material 114 for bonding the dies 100 adhering to the adsorption surface 24 or the die 100.

In order to inhibit the adhesive material 114 adhering to the adsorption surface 24 and the die 100 by the porous sheet 44, the entire adsorption surface 24 and the die 100 are necessary to be covered. However, when a material having a large shrinkage factor is used due to heat of about 300° C. applied to the porous sheet 44, it is expected that a part of the adsorption surface 24 or the die 100 will be exposed and the adhesive material 114 will adhere to the surface thereof.

Also, if a material that deforms into a curl or the like is used for the porous sheet 44, when the porous sheet 44 comes into contact with the adsorption surface 24, when the die 100 is mounted, or the like, it is expected that the porous sheet 44 will be rolled up, a part of the adsorption surface 24 or the die 100 will be exposed, and the adhesive material 114 will adhere to the surface thereof. Further, it is conceivable that, when the porous sheet 44 to which the adhesive material 114 has adhered is deformed, the adhesive material 114 may adhere to an unexpected position and cause a defect of the die 100.

Returning to the flowchart of FIG. 2, next, the porous sheet 44 is sandwiched between the adsorption surface 24 of the vacuum adsorption tool 22 and the first surface 102a (bump formation surface) of the die 100, and the die 100 is adsorbed by the vacuum adsorption tool 22 (S13). Specifically, in FIG. 3, the vacuum adsorption tool 22 is lowered and evacuation is performed from the suction hole 25 of the vacuum adsorption tool 22 in a state in which the porous sheet 44 is sandwiched between the adsorption surface 24 of the vacuum adsorption tool 22 and the first surface 102a of the die 100. In this way, the die 100 can be adsorbed through the porous sheet 44 to the adsorption surface 24 of the vacuum adsorption tool 22. Thereafter, the vacuum adsorption tool 22 is transferred to the bonding stage 16 together with the porous sheet 44. In this way, the die 100 is transferred onto a bonding region of the substrate 110.

Next, the die 100 is mounted on the bonding region of the substrate 110 via the adhesive material 114 (S14). Specifically, the adhesive material 114 is provided in the bonding region of the substrate 110 in advance, the vacuum adsorption tool 22 is lowered, and the first surface 102a of the die 100 is pressed through the porous sheet 44 by the vacuum adsorption tool 22 as illustrated in FIG. 4. At this time, the die 100 and the adhesive material 114 are heated. Thereby, the adhesive material 114 is heated and melted, and then cured. In this way, as illustrated in FIG. 4, the die 100 is mounted on the bonding region of the substrate 110 via the adhesive material 114 with the porous sheet 44 sandwiched between the adsorption surface 24 and the first surface 102a.

The adhesive material 114 formed in a sheet shape at room temperature may be used or the adhesive material 114 formed in a paste shape at room temperature may be used. The adhesive material 114 may be, for example, a thermosetting resin. In this case, the adhesive material 114 can be melted and cured by being heated.

It is preferable that a thickness T2 (T2≤T1) of the porous sheet 44 at the time of pressurization has a relationship of T2≥H with the protrusion height H of the bump electrode 106.

According to this, when the die 100 is mounted on the bonding region of the substrate 110, the porous sheet 44 can be provided in the gap between the adsorption surface 24 of the vacuum adsorption tool 22 and the first surface 102a of the die 100. Thereby, since air leakage from the gap can be prevented, an adsorption force for the die 100 due to suctioning from the suction hole 25 can be maintained. Further, since an air passing through the gap can be blocked, uniform heating can be achieved.

Also, when the porous sheet 44 is provided in the gap, fume gases generated when the die 100 or the adhesive material 114 adhering to the adsorption surface 24 of the vacuum adsorption tool 22 or entering the suction hole 25 can be inhibited. Therefore, contamination of the adsorption surface 24, the suction holes 25, or the like of the vacuum adsorption tool 22 can be inhibited, and maintainability can be enhanced.

Here, as illustrated in FIG. 5, the adsorption surface 24 of the vacuum adsorption tool 22 may have a size larger than that of the first surface 102a of the die 100. Specifically, a width WX in the X-axis direction and a width WY in the Y-axis direction of the vacuum adsorption tool 22, and a width DX in the X-axis direction and a width DY in the Y-axis direction of the die 100 may have a relationship of WX≥DX and WY≥DY.

According to this, the die 100 can be reliably pressed by the adsorption surface 24, and a pressing force on the first surface 102a of the die 100 can be made uniform. Further, in the present embodiment, since the porous sheet 44 is interposed between the adsorption surface 24 and the first surface 102a, when the die 100 is mounted on the substrate 110 via the adhesive material 114, the adhesive material 114 creeping up on a lateral surface of the die 100 can be blocked by the porous sheet 44. Therefore, the adhesive material 114 can be prevented from adhering to the adsorption surface 24 of the vacuum adsorption tool 22.

Also, as illustrated in FIG. 4, when a width W1 of the suction hole 25 of the vacuum suction tool 22 and a width W2 at both ends of the width W1 are defined in the width WX of the vacuum suction tool 22 in the X-axis direction, a relationship therebetween may be W1<W2. Also, a relationship between the width W2 of the vacuum adsorption tool 22 and the thickness T2 of the porous sheet 44 at the time of pressurization may be T2>W2 (or T1>W2).

According to this, since a distance from an end portion of the vacuum adsorption tool 22 to the suction hole 25 is smaller than the thickness of the porous sheet 44, even when the thickness of the porous sheet 44 is made to be equal to or greater than the protrusion height H of the bump electrode 106, a suction force of the vacuum adsorption tool 22 can be prevented from being impaired.

The present invention is not limited to the above-described embodiment and various modifications can be made and applied. For example, in the above-described configuration, the intermediate stage 14 may be omitted, and the die 100 picked up from the wafer stage 12 with the porous sheet 44 sandwiched between the vacuum adsorption tool 22 and the wafer stage 12 may be transferred to the bonding stage 16.

Also, the porous sheet 44 mounted on the pair of reels 40 and 42 is used in the above-described embodiment, but the porous sheet 44 may be prepared as a plurality of individual pieces of sheets in advance, and the individual piece of the sheet may be interposed between the adsorption surface 24 of the vacuum adsorption tool 22 and the first surface 102a of the die 100.

EXAMPLES

Figure 6:
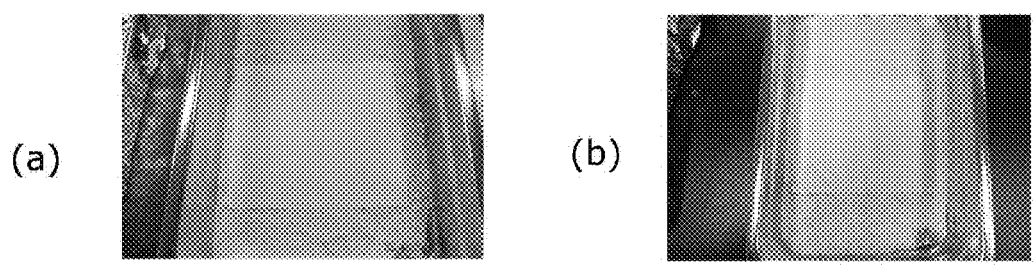
FIG. 6 shows photographs of external appearances of sheets before being heated, in which (a) of FIG. 6 shows a sheet according to an example, and (b) of FIG. 6 shows a sheet according to a comparative example.
Figure 7:
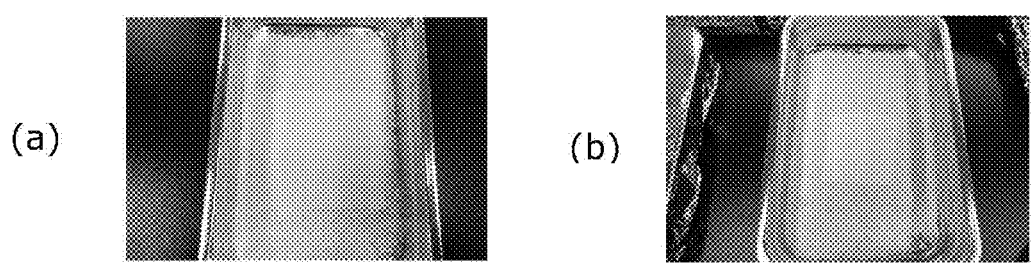
FIG. 7 shows photographs of external appearances of the samples after being heated to 250° C., in which (a) of FIG. 7 shows the sheet according to the example, and (b) of FIG. 7 shows the sheet according to the comparative example.

Next, examples of the present invention will be described. FIG. 6 shows photographs of external appearances of sheets before being heated, in which (a) of FIG. 6 shows a sheet according to an example, and (b) of FIG. 6 shows a sheet according to a comparative example. FIG. 7 shows photographs of external appearances of the samples after being heated to 250° C., in which (a) of FIG. 7 shows the sheet according to the example, and (b) of FIG. 7 shows the sheet according to the comparative example. Table 1 shows results from measurement of shrinkage factors of the PTFE nanofiber sheet according to the example of the present invention and the PTFE stretched sheet according to the comparative example.

The PTFE nanofiber sheet used in the present example was obtained by forming a PTFE material fiberized by electrospinning method into a sheet shape and then heating the sheet.

(Measurement Method)

For the PTFE nanofiber sheet according to the example and the PTFE stretched sheet according to the comparative example, shrinkage factors of the two sheets were measured at each temperature of 250° C., 300° C., and 350° C. For the measurement of the shrinkage factor, each sheet was disposed in a metal vat lined with kaolin (dry china clay) as shown in FIG. 6, and each sheet was heated in an electric furnace under conditions of 250° C., 300° C., and 350° C. for 10 minutes each.

The shrinkage factor of each sheet was calculated by measuring a dimensional change of each sheet cooled after the heating. The dimensional change of the sheet according to the example was calculated by cutting the sheet into a square of 120 mm, giving four measurement points in a width of 100 mm, measuring distances between the measurement points of the sheet before being heated and after being heated and cooled, and calculating the difference. In Table 1, distances A and C were measured in the width direction of the sheet, and distances B and D were measured in the winding direction of the sheet. Also, in the stretched sheet according to the comparative example, since measuring distance between the measurement points was not possible, the shrinkage factor was calculated on the basis of a difference between external dimensions before and after being heated.

(Measurement Result)

As a result of measuring the shrinkage factor of the example and the comparative example at each temperature, the result shown in Table 1 was obtained That is, it can be ascertained that the shrinkage factor in the width direction of the nanofiber sheet according to the example is significantly small by about 1/5 to 1/10 of the shrinkage factor in the width direction of the stretched sheet according to the comparative example at each temperature of 250° C., 300° C., and 350° C. Also, the shrinkage factor in the winding direction of the example also is significantly small by about 1/3 to 1/4 of the shrinkage factor of the comparative example at each temperature of 250° C., 300° C., and 350° C. Further, regarding the external appearance of the sheet also, it can be ascertained that the stretched sheet of the comparative example has shrunk much more than the nanofiber sheet of the example as shown in FIGS. 6 and 7.

Since the stretched sheet according to the comparative example is made by stretching a PTFE material at a low temperature and then heating it at the time of manufacturing, the stretched sheet has a residual stress generated in a compression direction due to the stretching. Therefore, when the stretched sheet is reheated at the time of mounting the die, the stretched sheet largely shrinks because the residual stress in the compression direction is released.

In contrast, since the nanofiber sheet according to the example is made by spinning PTFE fibers having a fiber diameter of less than 1 μm, the nanofiber sheet can have a reduced residual stress particularly in the width direction without stretching the sheet. Further, although the nanofiber sheet exhibits a shrinkage factor of about 10%, this is generated when the nanofiber sheet is heated to a temperature equal to or higher than a melting point of the PTFE at the time of manufacturing and is considered to be due to resin properties of the PTFE.

Further, the sheets according to the example and the comparative example were each sandwiched between the die and the adsorption tool, and a differential pressure of vacuum pressures changed before and after the adsorption tool adsorbed the die was measured. The vacuum pressure was measured by a pressure gauge (not illustrated) disposed downstream of the suction hole of the adsorption tool. As a result of the measurement, the differential pressure was 7.0 kPa when the nanofiber sheet according to the example was used and was 4.2 kPa when the stretched sheet according to the comparative example was used.

Thicknesses of the sheets used when the differential pressure of the vacuum pressure was measured were 56 μm in the example and 25 μm in the comparative example. That is, the nanofiber sheet according to the example has a higher differential pressure regardless of being about twice as thick as the stretched sheet according to the comparative example. That is, since the nanofiber sheet according to the example has a smaller pressure loss than the stretched sheet according to the comparative example, the nanofiber sheet can effectively and reliably adsorb the bump formation surface of the die 100. Also, since the nanofiber sheet according to the example has a small pressure loss, even when a thicker nanofiber sheet is applied, the nanofiber sheet can adsorb the bump formation surface of the die 100.

As described above, the nanofiber sheet according to the example has a significantly reduced shrinkage factor compared to the widely used stretched PTFE sheet. As described in the embodiment, when the sheet is used for the purpose of inhibiting the adhesion due to creeping up of the adhesive material, it is necessary to dispose a sheet having a sufficient size in consideration of the shrinkage factor and a device for conveying the sheet, causing waste of a space for the device. Further, in order to suppress shrinkage of the sheet, a mechanism such as a clamper for restraining the sheet is required, and time and effort for changing a process such as lowering a temperature of the heater are required. When the nanofiber sheet according to the example is used, it is possible to effectively inhibit adhesion of the adhesive material without changing a layout of the device and a process of mounting the die.

TABLE 1

| Sample | | | 250° C. | | | 300° C. | | | 350° C. | | |
|---|---|---|---|---|---|---|---|---|---|---|---|
| | | | Before | After | Shrinkage factor | Before | After | Shrinkage factor | Before | After | Shrinkage factor |
| Example | 1 | A | 100 | 100 | 1.0% | 100.5 | 101 | −0.5% | 100.5 | 93 | 7.5% |
| | | B | 96 | 91 | 5.2% | 97.7 | 92 | 5.8% | 97 | 84.5 | 14.0% |
| | | C | 100 | 100 | 0.0% | 100.5 | 100.5 | 0.0% | 100 | 93.5 | 9.0% |
| | | D | 96 | 90.5 | 5.7% | 97.5 | 92.5 | 4.7% | 96.5 | 84.5 | 13.5% |
| | 2 | A | 100 | 100 | 0.0% | 100.5 | 101 | −0.5% | 100.5 | 95.5 | 5.0% |
| | | B | 96 | 92 | 4.2% | 96 | 92 | 5.2% | 97 | 84.5 | 12.9% |
| | | C | 100 | 100 | 0.0% | 100.5 | 100.5 | −0.5% | 100 | 93.5 | 6.5% |
| | | D | 96 | 91.5 | 4.7% | 95.5 | 92.5 | 4.7% | 96. | 84.5 | 12.4% |
| Comparative example | 1 | A | 120 | 85 | 29.2% | 117 | 66 | 43.6% | 119 | 58 | 51.3% |
| | | B | 119 | 68 | 42.9% | 120 | — | cannot be measured | 119 | 50 | 58.0% |
| | | C | 120 | 85 | 29.2% | 120 | 78 | 35.0% | 120 | 56 | 53.3% |
| | | D | 119 | 67 | 43.7% | 118 | — | cannot be measured | 119 | 50 | 58.0% |
| | 2 | A | 117 | 71 | 39.3% | 121 | 75 | 38.0% | 119 | 60 | 49.6% |
| | | B | 119 | 81 | 31.9% | 119 | 60 | 49.6% | 115.5 | 55 | 52.4% |
| | | C | 117 | 68 | 41.9% | 118 | 76 | 35.6% | 119 | 61 | 48.7% |
| | | D | 118 | 81 | 31.4% | 121 | 63 | 47.9% | 118.5 | 55 | 53.6% |

Implementation aspects described through the embodiments of the above-described invention can be used in combination or with modifications or improvements as appropriate depending on applications, and the present invention is not limited to the description of the embodiments described above. It is apparent from the description of the scope of the claims that embodiments with such combinations, modifications, or improvements can also be included in the technical scope of the present invention.

REFERENCE SIGNS LIST

22 Vacuum adsorption tool
24 Adsorption surface
44 Porous sheet
100 Die
102a First surface
102b Second surface
106 Bump electrode
110 Substrate
114 Adhesive material

The invention claimed is:

1. A polytetrafluoroethylene (PTFE) sheet in which PTFE fibers having a diameter of 1 μm or less are spun, wherein
a PTFE sheet having a Gurley value in a range of 1 to 3 s/100 cc/in$^2$ and a shrinkage factor of 10% or less in a direction perpendicular to a sheet winding direction when heated to 300° C. is sandwiched between a tool for heating a die and a die when the die is mounted on a mounting body so that the die is able to be adsorbed by the tool and adhering of an adhesive member for fixing the die to the mounting body to an adsorption surface of the tool or the die is inhibited, and
the PTFE sheet has a thickness equal to or greater than a protrusion height of a bump electrode on a bump formation surface of the die and is able to adsorb the bump formation surface of the die.

2. The PTFE sheet according to claim 1, wherein the PTFE sheet is made of a material softer than that of the bump electrode or the adsorption surface.

3. The PTFE sheet according to claim 2, wherein
the tool is configured to mount the die on a bonding region of the mounting body by heating the die and the adhesive member, and
the PTFE sheet serves as a filter which inhibits fume gases generated when the die or the adhesive material is heated entering a suction hole of the tool.

4. The PTFE sheet according to claim 1, wherein
the tool is configured to mount the die on a bonding region of the mounting body by heating the die and the adhesive member, and
the PTFE sheet serves as a filter which inhibits fume gases generated when the die or the adhesive material is heated entering a suction hole of the tool.

5. The PTFE sheet according to claim 1, wherein
the tool is configured to mount the die on a bonding region of the mounting body by heating the die and the adhesive member, and
the PTFE sheet serves as a filter which inhibits fume gases generated when the die or the adhesive material is heated entering a suction hole of the tool.

6. A method of mounting a die, comprising:
a step of preparing a die including a bump formation surface on which a plurality of bump electrodes is formed;
a step of preparing a polytetrafluoroethylene (PTFE) sheet in which PTFE fibers having a diameter of 1 μm or less are spun, a Gurley value is in a range of 1 to 3 s/100 cc/in$^2$, and a shrinkage factor in a direction perpendicular to a sheet winding direction when heated to 300° C. is 10% or less;
a step of disposing a vacuum adsorption tool having an adsorption surface above the die such that the adsorption surface faces the bump formation surface;
a step of sandwiching the PTFE sheet between the adsorption surface and the bump formation surface and adsorbing the die using the vacuum adsorption tool; and
a step of mounting the die adsorbed by the vacuum adsorption tool on a bonding region of a substrate via an adhesive material, wherein
the PTFE sheet has a thickness equal to or greater than a protrusion height of the bump electrode on the bump formation surface.

* * * * *